United States Patent
Liang et al.

(10) Patent No.: US 12,189,562 B2
(45) Date of Patent: Jan. 7, 2025

(54) MEMORY SYSTEM WITH SELECTIVELY INTERFACEABLE MEMORY SUBSYSTEM

(71) Applicant: Micron Technology, Inc., Boise, ID (US)

(72) Inventors: Qing Liang, Boise, ID (US); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 17/846,988

(22) Filed: Jun. 22, 2022

(65) Prior Publication Data

US 2022/0318176 A1    Oct. 6, 2022

Related U.S. Application Data

(63) Continuation of application No. 16/893,205, filed on Jun. 4, 2020, now Pat. No. 11,392,526.

(51) Int. Cl.
*G06F 13/40* (2006.01)
*G11C 11/00* (2006.01)

(52) U.S. Cl.
CPC ........ *G06F 13/4027* (2013.01); *G11C 11/005* (2013.01)

(58) Field of Classification Search
None
See application file for complete search history.

(56) References Cited

U.S. PATENT DOCUMENTS

| | | | |
|---|---|---|---|
| 7,873,750 B2 | 1/2011 | Yabuta et al. | |
| 9,465,771 B2 | 10/2016 | Davis et al. | |
| 10,224,928 B1* | 3/2019 | Mathur | G11C 11/40615 |
| 10,409,512 B2* | 9/2019 | Kim | G06F 3/0659 |
| 10,410,109 B2 | 9/2019 | Akopyan et al. | |
| 10,545,685 B2* | 1/2020 | Tanpairoj | G06F 3/0655 |
| 11,392,526 B2* | 7/2022 | Liang | G11C 11/005 |
| 2004/0010612 A1 | 1/2004 | Pandya | |
| 2008/0209112 A1* | 8/2008 | Yu | G06F 12/0246 |
| | | | 711/E12.001 |
| 2009/0048819 A1* | 2/2009 | Norman | G11C 11/005 |
| | | | 711/170 |
| 2012/0239854 A1* | 9/2012 | Hsueh | G06F 12/0246 |
| | | | 711/E12.008 |

(Continued)

*Primary Examiner* — Henry Tsai
*Assistant Examiner* — Christopher A Bartels
(74) *Attorney, Agent, or Firm* — Holland & Hart LLP

(57) ABSTRACT

Methods, systems, and devices for memory systems having a selectively interfaceable memory subsystem are described. A memory system may include the memory subsystem that may be configurable to provide volatile storage, nonvolatile storage, or both to a host system. The memory subsystem may include a plurality of ports each capable of communicating with the host system using different interfaces. The memory subsystem may be dynamically configurable to perform different functions based on the demands of the host system. In some examples, memory systems described herein may include a first memory subsystem to provide nonvolatile storage to the host system, a second memory subsystem to provide volatile storage to the host system, and a third memory subsystem configurable to provide volatile storage or nonvolatile storage or both to the host system.

20 Claims, 6 Drawing Sheets

(56) References Cited

U.S. PATENT DOCUMENTS

| | | | |
|---|---|---|---|
| 2013/0067138 A1* | 3/2013 | Schuette | G06F 3/0629 |
| | | | 711/E12.008 |
| 2014/0098613 A1 | 4/2014 | Kim | |
| 2014/0192583 A1* | 7/2014 | Rajan | G11C 7/10 |
| | | | 365/63 |
| 2016/0005454 A1* | 1/2016 | Mun | G06F 9/4401 |
| | | | 365/201 |
| 2018/0024964 A1 | 1/2018 | Mao et al. | |
| 2019/0004895 A1* | 1/2019 | Lee | G06F 11/1048 |
| 2019/0004954 A1* | 1/2019 | Kumar | G06F 12/0862 |
| 2019/0042451 A1* | 2/2019 | Leone | G06F 12/0871 |
| 2019/0065080 A1 | 2/2019 | Tanpairoj et al. | |
| 2019/0370169 A1* | 12/2019 | Amato | G06F 12/1018 |
| 2019/0384713 A1* | 12/2019 | De | G06F 12/0888 |
| 2020/0042223 A1* | 2/2020 | Li | G11C 29/52 |
| 2020/0350320 A1* | 11/2020 | Cheng | H10B 63/30 |
| 2021/0090983 A1* | 3/2021 | Lin | H01L 25/50 |
| 2021/0117117 A1* | 4/2021 | Mahesh | G06F 3/0608 |
| 2021/0117320 A1* | 4/2021 | Mahesh | G06F 11/1076 |
| 2021/0133543 A1 | 5/2021 | Lim et al. | |
| 2021/0173588 A1* | 6/2021 | Kannan | G06F 3/061 |
| 2021/0200631 A1 | 7/2021 | Palmer et al. | |
| 2022/0365705 A1* | 11/2022 | Basu | G06F 3/0679 |
| 2022/0365720 A1* | 11/2022 | Basu | G06F 3/0685 |

\* cited by examiner

MEMORY SYSTEM WITH SELECTIVELY INTERFACEABLE MEMORY SUBSYSTEM

CROSS REFERENCE

The present application for patent is a continuation of U.S. patent application Ser. No. 16/893,205 by Liang, et al., entitled "MEMORY SYSTEM WITH SELECTIVELY INTERFACEABLE MEMORY SUBSYSTEM", filed Jun. 4, 2020, assigned to the assignee hereof, and is expressly incorporated by reference in its entirety herein.

BACKGROUND

The following relates generally to one or more systems for memory and more specifically to a memory system with selectively interfaceable memory subsystem.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint or 3DXP), not-or (NOR), and not-and (NAND) memory devices, and others.

DETAILED DESCRIPTION

Figure 1:
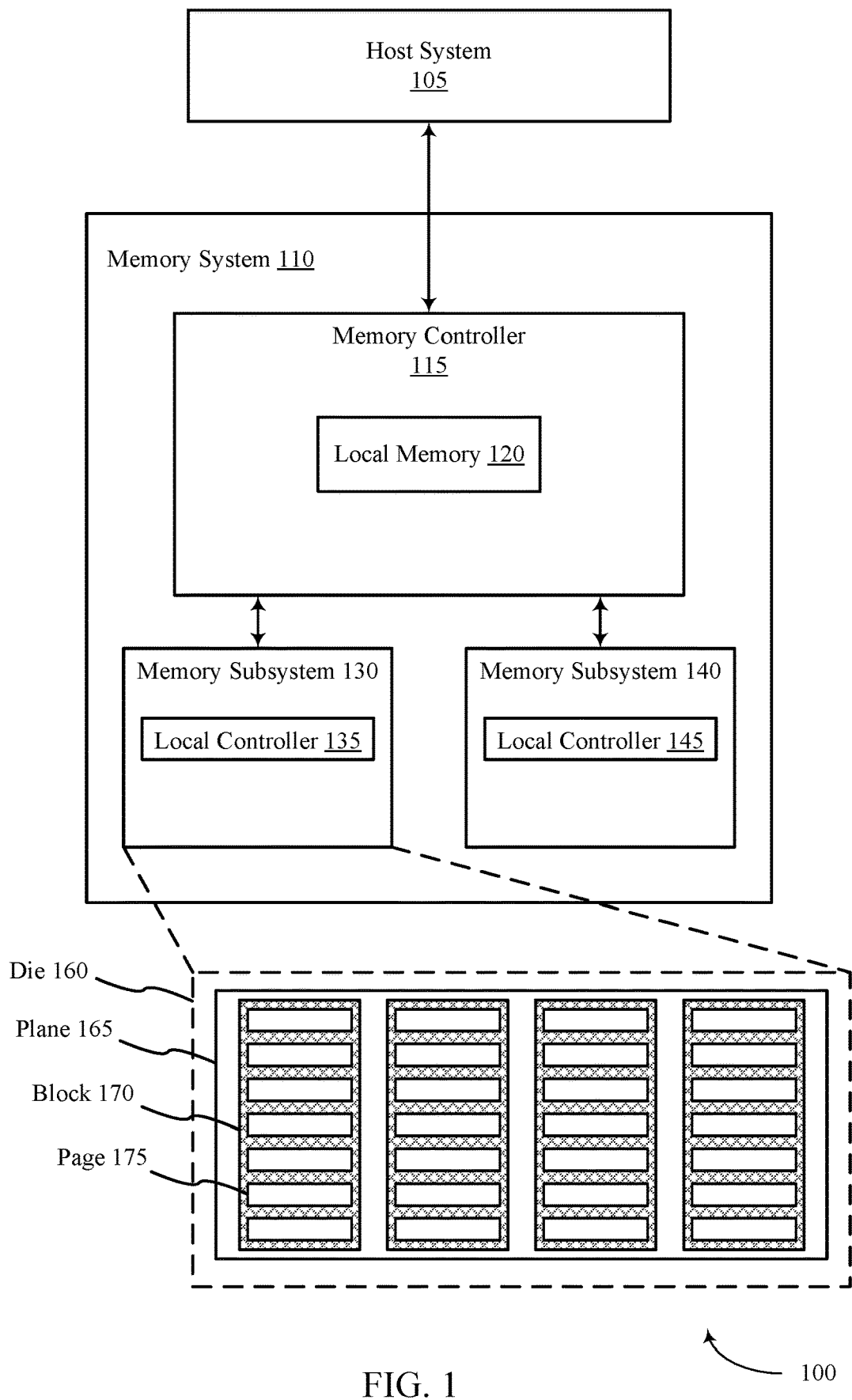
FIG. 1 illustrates an example of a system that supports a memory system with selectively interfaceable memory subsystem in accordance with examples as disclosed herein.

Memory devices may be volatile or nonvolatile. Volatile memory cells may lose their programmed states over time unless they are periodically refreshed by an external power source. For example, DRAM memory cells may be considered to be volatile memory cells. Nonvolatile memory cells may maintain their programmed states for extended periods of time even in the absence of an external power source. For example, NAND memory cells may be considered to be nonvolatile memory cells. In general, volatile memory has a faster access time than nonvolatile memory. In some systems, volatile and nonvolatile memory may be referred to as "memory" and "storage," respectively.

Computing systems generally include volatile memory that a host system may use during real-time operations and nonvolatile memory to store information. At times, a system may use more volatile storage than normal, such as, e.g., when using artificial intelligence (AI) software or playing video games. At other times, the system may use more nonvolatile storage than normal, such as, e.g., when using 5G data or streaming high-definition video. To handle those cases with less overall memory, it may be desirable to have a portion of the system's memory be dynamically configurable to act as volatile memory or nonvolatile memory. Such a system may be able to dynamically adjust the size of memory and storage to match the system's needs. This would be useful for systems having physical memory limitations, such as mobile devices.

Some memory cells may be used as volatile or nonvolatile memory. For example, FeRAM memory cells may be used as nonvolatile memory because they can maintain their programmed states for an extended period of time. Some FeRAM memory cells may have a fast access time and may be used as volatile memory. In another example, some resistive RAM, e.g., 3DXP memories, may include FeRAM memory cells that may be used as volatile memory. Other types of memory cells may also be used as volatile or nonvolatile memory.

Systems, devices, and techniques are described that include a memory subsystem with memory that may be configurable to provide volatile storage, nonvolatile storage, or both to a host system. The memory subsystem may include a plurality of ports each capable of communicating with the host system using different interfaces. The memory subsystem may be dynamically configurable to perform different functions based on the demands of the host system. Using this memory subsystem, the host system may dynamically adjust the size of random-access memory and the size of the storage to match the host system's needs. In some examples, memory systems described herein may include a first memory subsystem to provide nonvolatile storage to the host system, a second memory subsystem to provide volatile storage to the host system, and a third memory subsystem configurable to provide volatile storage or nonvolatile storage or both to the host system.

Features of the disclosure are initially described in the context of a memory system as described with reference to FIG. 1. Features of the disclosure are described in the context of a system, a subsystem, and a flowchart as described with reference to FIGS. 2-4. These and other features of the disclosure are further illustrated by and described with reference to an apparatus diagram and a flowchart that relate to a memory system with selectively interfaceable memory subsystem as described with reference to FIGS. 5-6.

FIG. 1 illustrates an example of a system 100 that supports a memory system with selectively interfaceable memory subsystem in accordance with examples as disclosed herein. The system 100 may include a host system 105 coupled with a memory system 110.

A memory system 110 may be any device or collection of devices that includes one or more memory arrays. For example, a memory system 110 may be or include a solid-state drive (SSD), a flash drive, a universal serial bus (USB) flash drive, a Universal Flash Storage (UFS) drive, an embedded Multi-Media Controller (eMMC) drive, a secure digital (SD) card, a hard disk drive (HDD), a dual in-line memory module (DIMM), a small outline DIMM (SO-DIMM), or a nonvolatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The host system 105 may include a processor chipset and a software stack executed by the processor chipset. The processor chipset may include one or more cores, one or more caches (e.g., memory local to or included in the host system 105), a memory controller (e.g., NVDIMM controller), and a storage protocol controller (e.g., PCIe controller, SATA controller). The host system 105 may use the memory system 110, for example, to write data to the memory system 110 and read data from the memory system 110. Though one memory system 110 is shown in FIG. 1, the host system 105 may be coupled with any quantity of memory systems 110.

The host system 105 may be coupled with the memory system 110 via a physical host interface, which may provide an interface and, in at least some cases, an associated protocol for passing control, address, data, and other signals between the memory system 110 and the host system 105. Examples of a physical host interface include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface.

Memory system 110 may include a memory subsystem controller 115, a memory subsystem 130, and a memory subsystem 140. A memory subsystem 130 may include one or more memory arrays of a first type of memory cells (e.g., a type of nonvolatile memory cells), and a memory subsystem 140 may include one or more memory arrays of a second type of memory cells (e.g., a type of volatile memory cells). Though one memory subsystem 130 and one memory subsystem 140 are shown in the example of FIG. 1, the memory system 110 may include any quantity of memory subsystems 130 and memory subsystems 140, and that, in some cases, memory system 110 may lack either a memory subsystem 130 or a memory subsystem 140.

The memory subsystem controller 115 may be coupled with and communicate with the host system 105 (e.g., via the physical host interface). The memory subsystem controller 115 may also be coupled with and communicate with memory subsystems 130 or memory subsystems 140 to perform operations such as reading data, writing data, erasing data, or refreshing data at a memory subsystem 130 or a memory subsystem 140, and other such operations, which may generically be referred to as access operations. In some cases, the memory subsystem controller 115 may receive commands from the host system 105 and communicate with one or more memory subsystems 130 or memory subsystems 140 to execute such commands (e.g., at memory arrays within the one or more memory subsystems 130 or memory subsystems 140). For example, the memory subsystem controller 115 may receive commands or operations from the host system 105 and may convert the commands or operations into instructions or appropriate commands to achieve the desired access to the memory subsystems 130 or memory subsystems 140. And in some cases, the memory subsystem controller 115 may exchange data with the host system 105 and with one or more memory subsystems 130 or memory subsystems 140 (e.g., in response to or otherwise in association with commands from the host system 105). For example, the memory subsystem controller 115 may convert responses (e.g., data packets or other signals) associated with the memory subsystems 130 or memory subsystems 140 into corresponding signals for the host system 105.

The memory subsystem controller 115 may be responsible for other operations associated with the memory subsystems 130 or memory subsystems 140. For example, the memory subsystem controller 115 may execute or manage operations such as wear-leveling operations, garbage collection operations, error checking operations such as error detection or error-correcting code (ECC), encryption operations, caching operations, media management operations, and address translations between logical addresses (e.g., logical block addresses (LBAs)) associated with commands from the host system 105 and physical addresses (e.g., physical block addresses) associated with memory cells within the memory subsystems 130 or memory subsystems 140.

The memory subsystem controller 115 may include hardware such as one or more integrated circuits or discrete components, a buffer memory, or a combination thereof. The hardware may include digital circuitry with dedicated (e.g., hard-coded) logic to perform the operations ascribed herein to the memory subsystem controller 115. The memory subsystem controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The controller may also include a local memory 120. In some cases, the local memory 120 may include read-only memory (ROM) or other memory that may store operating code (e.g., executable instructions) executable by the memory subsystem controller 115 to perform functions ascribed herein to the memory subsystem controller 115. In some cases, the local memory 120 may additionally or alternatively include static random access memory (SRAM) memory or other memory that may be used by the memory subsystem controller 115 for internal storage or calculations, for example, related to the functions ascribed herein to the memory subsystem controller 115. Additionally or alternatively, the local memory 120 may serve as a cache for the memory subsystem controller 115. For example, data may be stored to the local memory 120 when read from or written to a memory subsystem 130 or memory subsystem 140, and may be available within the local memory 120 for subsequent retrieval for or manipulation (updating) by the host system 105 (e.g., with reduced latency relative to a memory subsystem 130 or memory subsystem 140) in accordance with a cache policy.

While the example memory system 110 in FIG. 1 has been illustrated as including the memory subsystem controller 115, in some cases, a memory system 110 does not include a memory subsystem controller 115. For example, the memory system 110 may instead rely upon an external controller (e.g., implemented by the host system 105) or one or more local controllers 135 or local controllers 145, internal to memory subsystems 130 or memory subsystems 140, respectively, to perform the functions ascribed herein to the memory subsystem controller 115. In general, one or more functions ascribed herein to the memory subsystem controller 115 may in some cases be instead performed by the host system 105, a local controller 135, or a local controller 145.

A memory subsystem 140 may include one or more arrays of volatile memory cells. For example, a memory subsystem 140 may include random access memory (RAM) memory cells, such as dynamic RAM (DRAM) memory cells and synchronous DRAM (SDRAM) memory cells.

A memory subsystem 130 may include one or more arrays of nonvolatile memory cells. For example, a memory subsystem 130 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory subsystem 130 or a memory subsystem 140 may include a local controller 135 or a local controller 145, respectively, which may execute operations on one or more memory cells of the memory subsystem 130 or the memory subsystem 140. A local controller 135 or a local controller 145 may operate in conjunction with a memory subsystem controller 115 or may perform one or more functions ascribed herein to the memory subsystem controller 115. In some cases, a memory subsystem 130 or a memory subsystem 140 that includes a local controller 135 or a local controller 145 may be referred to as a managed memory device and may include a raw memory array and related circuitry (e.g., combined with a local (e.g., on-die or in-package) controller (e.g., local controller 135 or local controller 145). An example of a managed memory device is a managed NAND (MNAND) device.

In some cases, a memory subsystem 130 may be a NAND (e.g., NAND flash) device. The memory subsystem 130 may be a package that includes one or more dies 160. A die 160 may be a piece of electronics-grade semiconductor cut from a wafer (e.g., a silicon die cut from a silicon wafer). Each die 160 may include one or more planes 165, and each plane 165 may include a respective set of blocks 170, where each block 170 includes a respective set of pages 175, and each page 175 includes a set of memory cells.

In some cases, a NAND memory subsystem 130 may include memory cells configured to each store one bit of information, which may be referred to as single level cells (SLCs). Additionally or alternatively, a NAND memory subsystem 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. multiple-level memory cells may provide greater density of storage relative to SLC memory cells but may, in some cases, involve narrower read or write margins or greater complexities for supporting circuitry.

In some cases, planes 165 may refer to groups of blocks 170 for which concurrent operations may take place on different blocks 170 within different planes 165—that is, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common bit line.

For some NAND architectures, memory cells may be read and programmed (e.g., written) at the page 175 level of granularity but may be erased at the block 170 level of granularity. That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may not be updated without the entire block 170 that includes the page 175 being erased. To update some data within a block 170 while retaining other data within the block 170, the memory subsystem 130 may copy the data to be retained to a new block 170 and write the updated data to one or more remaining pages of the new block 170. The memory subsystem 130 (e.g., the local controller 135) or the memory subsystem controller 115 may mark or otherwise designate the data that remains in the old block 170 as invalid or obsolete, and update a logical-to-physical (L2P) mapping table to associate the logical address (e.g., LBA) for the data with the new, valid block 170 rather than the old, invalid block 170. In some cases, such copying and remapping may be preferable to erasing and rewriting the entire old block 170, due to latency or wear out considerations, for example. In some cases, one or more copies of an L2P mapping table may be stored within the memory cells of the memory subsystem 130 (e.g., within or more blocks 170 or planes 165) for use (e.g., reference and updating) by the local controller 135 or memory subsystem controller 115.

In some cases, L2P tables may be maintained and data may be marked as valid or invalid at the page 175 level of granularity, and a page 175 may contain valid data, invalid data, or no data. Invalid data may be data that is outdated due to a more recent or updated version of the data being stored in a different page 175 of the memory subsystem 130. Invalid data have been previously programmed to the invalid page 175 but may no longer be associated with a valid logical address, such as a logical address referenced by the host system 105. Valid data may be the most recent version of such data being stored on the memory subsystem 130. A page 175 that includes no data may be a page 175 that has never been written to or that has been erased.

In some cases, a memory subsystem controller 115, a local controller 135, or a local controller 145 may perform operations (e.g., as part of one or more media management algorithms) for a memory subsystem 130 or a memory subsystem 140, such as wear leveling, refresh, garbage collection, scrub, and others. For example, within a memory subsystem 130, a block 170 may have some pages 175 containing valid data and some pages 175 containing invalid data. To avoid waiting for some or all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the number of blocks 170 that have been erased may be increased such that more blocks 170 are available to store subsequent data (e.g., data subsequently received from the host system 105).

The system 100 may include non-transitory computer readable medium (e.g., local memory 125, memory subsystem 130, and/or memory subsystem 140) storing instructions (e.g., firmware) for performing the techniques for read prediction during a system boot procedure (e.g., methods 400 and 600), described herein. For example, the instructions, when executed by controller 115 (or more specifically processor of controller 115), may cause the controller to perform the methods for mapping descriptors described herein.

The memory system 100 may include a first memory subsystem to provide nonvolatile storage to the host system (e.g., a memory subsystem 130), a second memory subsystem to provide volatile storage to the host system (e.g., a memory subsystem 140), and a third memory subsystem configurable to provide volatile storage or nonvolatile storage or both to the host system. The third memory subsystem may include a plurality of ports each capable of communicating with the host system using different interfaces. The third memory subsystem may be dynamically configurable to perform different functions based on the demands of the host system.

Figure 2:
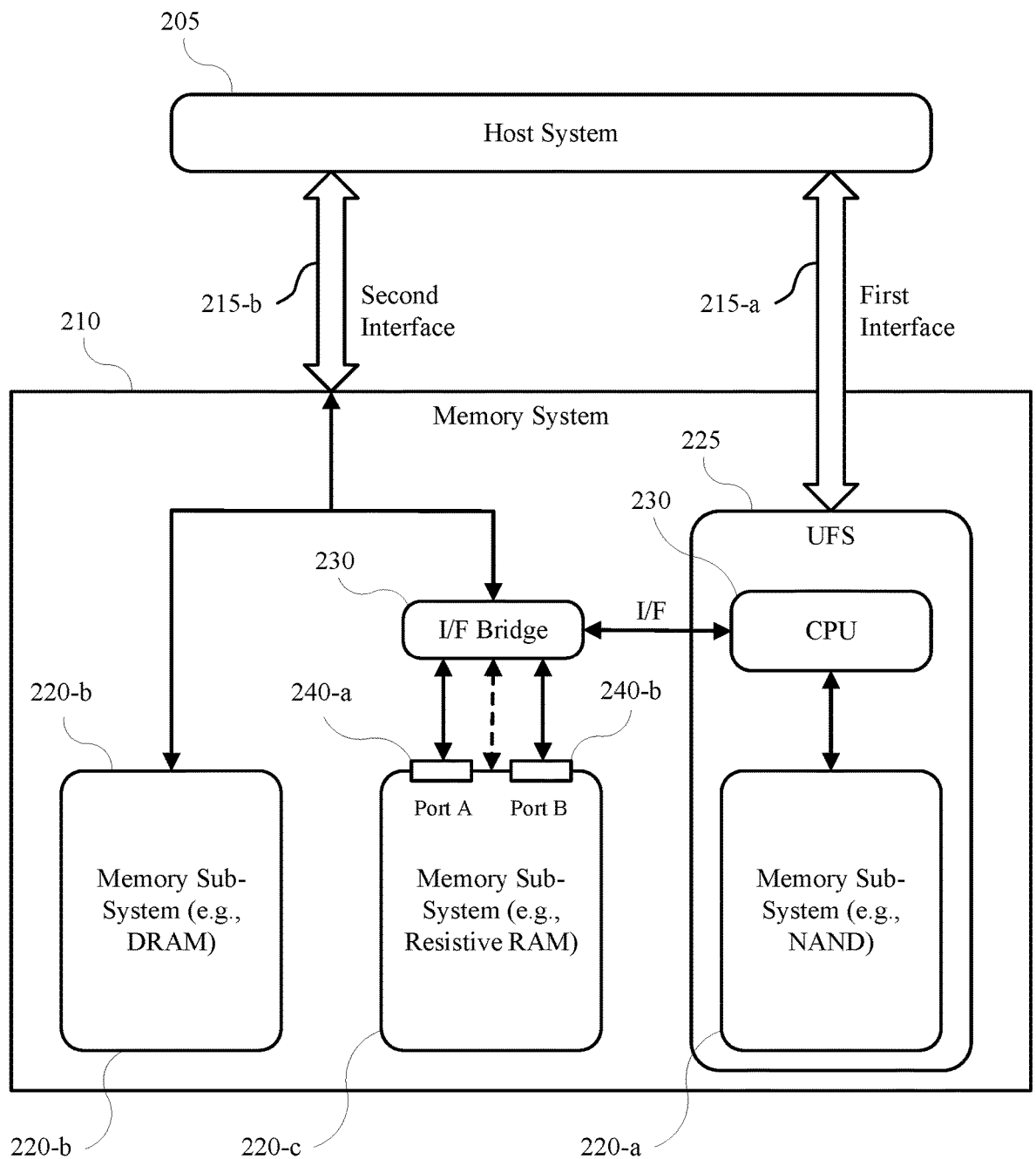
FIG. 2 illustrates an example of a system that supports a memory system with selectively interfaceable memory subsystem in accordance with examples as disclosed herein.

FIG. 2 illustrates an example of a system 200 that supports a memory system with selectively interfaceable memory subsystem in accordance with examples as disclosed herein. The system 200 may be an example of a system 100 described with reference to FIG. 1. As discussed with reference to FIG. 1, at times, a system may use more volatile storage than normal, such as, e.g., when using artificial intelligence (AI) software or playing video games. At other times, the system may use more nonvolatile storage than normal, such as, e.g., when using 5G data or streaming high-definition video. The system 200 may accommodate both of these cases using a memory system with dynamically reconfigurable memory.

The system 200 may include a host system 205 and a memory system 210. The host system 205 may be an example of a host system 105 described with reference to FIG. 1. The memory system 210 may be an example of a memory system 110 described with reference to FIG. 1. The host system 205 may provide indications to the memory system 210 to dynamically configure the memory system 210, as discussed below.

The host system 205 may be coupled with the memory system 210 via a plurality of interfaces 215. The interfaces 215 may be examples of physical host interfaces described with reference to FIG. 1. An interface may include a pin-out (a specific layout of pins and a specific assignment for what each pin does) and communication protocol(s) used to communicate information over those pins. The interfaces 215 may include a first interface 215-a and a second interface 215-b. In some cases, the first interface 215-a may be used for communication with nonvolatile memory and in those cases may be referred to as a nonvolatile-memory interface (e.g., a UFS interface that uses UFS-related communication protocols). In some cases, the second interface 215-b may be used for communication with volatile memory and in those cases may be referred to as a volatile-memory interface (e.g., a DRAM interface that uses DRAM-related communication protocols). Other interfaces may also couple the host system 205 with the memory system 210. The interfaces 215 may pass information therethrough and may provide, in at least some cases, an associated protocol for passing control, address, data, and other signals between the memory system 210 and the host system 205.

By way of example, the types of interfaces 215 can include, but are not limited to, SATA interfaces, UFS interface, eMMC interfaces, PCIe interfaces, USB interfaces, Fiber Channels, SCSIs, Serial Attached SCSIs, DDR memory buses, DIMM interfaces, Open NAND Flash Interfaces, LPDDR interfaces, or any other interfaces, or any combination thereof.

The memory system 210 may include a plurality of memory subsystems 220 couplable with the host system 205 via interfaces 215. Two or more of the memory subsystems 220 may reside on a single die, such as a multi-chip package (MCP), or all of the subsystems 220 may reside on separate dies. The memory subsystems 220 may be examples of a memory subsystems 130 or 140 described with reference to FIG. 1. The memory subsystems 220 can be of a same type or of different types. By way of example, the types can include, but are not limited to, magnetic hard disks, RAM, ROM, DRAM, SDRAM, FeRAM, MRAM, RRAM, flash memory, PCM, 33D Xpoint, not-or (NOR), and NAND memory devices, or others. Memory devices may be volatile or nonvolatile. Volatile memory cells may lose their programmed states over time unless they are periodically refreshed by an external power source. Nonvolatile memory cells may maintain their programmed states for extended periods of time even in the absence of an external power source.

In some examples, one of the memory subsystems 220 may be a nonvolatile type, one of the memory subsystems 220 may be a volatile type, and one of the memory subsystems 220 may be configurable to be a volatile type or a nonvolatile type or both. In some examples, the quantity of memory subsystems 220 is greater than the quantity of interfaces 215. In those cases, two or more of the memory subsystems 220 may communicate with the host system 205 using a same interface 215. In one example, one of the memory subsystem 220 may be configurable to share more than one interface 215.

In some examples, the memory system 210 may include a first memory subsystem 220-a, a second memory subsystem 220-b, and a third memory subsystem 220-c. In some examples, the first memory subsystem 220-a may be of a first type, the second memory subsystem 220-b may be of a second type and the third memory subsystem may be of a third type.

In some examples, the first memory subsystem 220-a may be a nonvolatile memory subsystem. For example the first memory subsystem 220-a may include one or more NAND memory cells. The first memory subsystem 220-*a* may communicate with the host system 205 via nonvolatile-memory interface 215-*a*. For example, the first memory subsystem 220-*a* may be part of a UFS device 225 that includes a central processing unit (CPU) 230 that communicates with the host system 205 via a UFS interface. That is, the first interface 215-*a* may be a UFS interface that the nonvolatile first memory subsystem 220-*a* may use to communicate information with the host system 205.

In some examples, the second memory subsystem 220-*b* may be a volatile memory subsystem. For example, the second memory subsystem 220-*b* may include one or more DRAM memory cells. The second memory subsystem 220-*b* may communicate with the host system 205 via a volatile-memory interface 215-*b*. For example, the second memory subsystem 220-*b* may communicate with the host system 205 via a DRAM interface. That is, the second interface 215-*b* may be a DRAM interface that the volatile second memory subsystem 220-*b* may use to communicate information with the host system 205

The third memory subsystem 220-*c* may be of a memory type that may be configurable to communicate with the host system 205 using two or more of the interfaces 215. In some examples, the third memory subsystem 220-*c* may be selectively configurable to operate as a nonvolatile memory subsystem or a volatile memory subsystem. In some examples, the third memory subsystem 220-*c* may be configured as a second nonvolatile memory subsystem when communicating information via the first interface 215-*a* and as a second volatile memory subsystem when communicating information via the second interface 215-*b*. In some embodiments, the third memory subsystem 220-*c* may be configurable to communicate with the host system 205 using multiple interfaces concurrently.

In some examples, third memory subsystem 220-*c* may be configurable to communicate with the host system 205 via nonvolatile-memory interface 215-*a* or volatile-memory interface 215-*b* or both. For example, when configured as a nonvolatile type, the third memory subsystem 220-*c* may communicate with the host system 205 via the first interface 215-*a*, and when configured as a volatile type, the third memory subsystem 220-*c* may communicate with the host system 205 via the second interface 215-*b*.

As described herein, some memory cells may be used as volatile or nonvolatile memory. For example, some resistive RAM, e.g., 3DXP memories, may include FeRAM memory cells that may be used as volatile memory. Other types of memory cells may also be used as volatile or nonvolatile memory. For example, FeRAM memory cells may be used as nonvolatile memory because they can maintain their programmed states for an extended period of time. Some FeRAM memory cells may have a fast access time and may be used as volatile memory.

In some examples, the third memory subsystem 220-*c* may include one or more resistive RAM memory cells, e.g., 3DXP memory cells. In some examples, the resistive RAM memory cells may be configured to act as nonvolatile memory and be routed through the nonvolatile-memory interface 215-*a*. In some examples, the resistive RAM memory cells may be configured to act as volatile memory and be routed through the volatile-memory interface 215-*b*. In some examples, the UFS device 225 may include NAND memory cells and resistive RAM memory cells. The NAND memory cells may be routed through the nonvolatile-memory interface 215-*a*.

The memory system 210 may include an interface bridge 235 that may couple the third memory subsystem 220-*c* with the correct interface 215. For example, the interface bridge 235 may couple the memory subsystem 220-*c* to the first interface 215-*a* or the second interface 215-*c*, depending on the configuration of the third memory subsystem 220-*c*. In some examples, when the third memory subsystem 220-*c* is configured to operate as nonvolatile memory, the interface bridge 235 may route information between the third memory subsystem 220-*c* and the host system 205 through the nonvolatile-memory interface 215-*a* via the CPU 230, and when the third memory subsystem 220-*c* is configured to operate as volatile memory, the interface bridge 235 may route the information through the volatile-memory interface 215-*b*. In some examples, the interface 215 to which the third memory subsystem 220-*c* is coupled may be dynamically reconfigurable.

The third memory subsystem 220-*c* may include a plurality of ports 240 through which the third memory subsystem 220-*c* may be configured to communicate information with the host system 205. Each port 240 may be coupled with the interfaces 215 and configurable to cause the third memory subsystem 220-*c* to communicate information with the host system 205 via a particular interface 215. For example, a first port 240-*a* may be configured to cause the third memory subsystem 220-*c* to communicate information with the host system 205 via the first interface 215-*a* and a second port 240-*b* may be configured to cause the third memory subsystem 220-*c* to communicate information with the host system 205 via the second interface 215-*b*. Each port 240 may be coupled with the interface bridge 235 so that information through each port 240 may be routed by the interface bridge 235 to interfaces 215.

Figure 3:
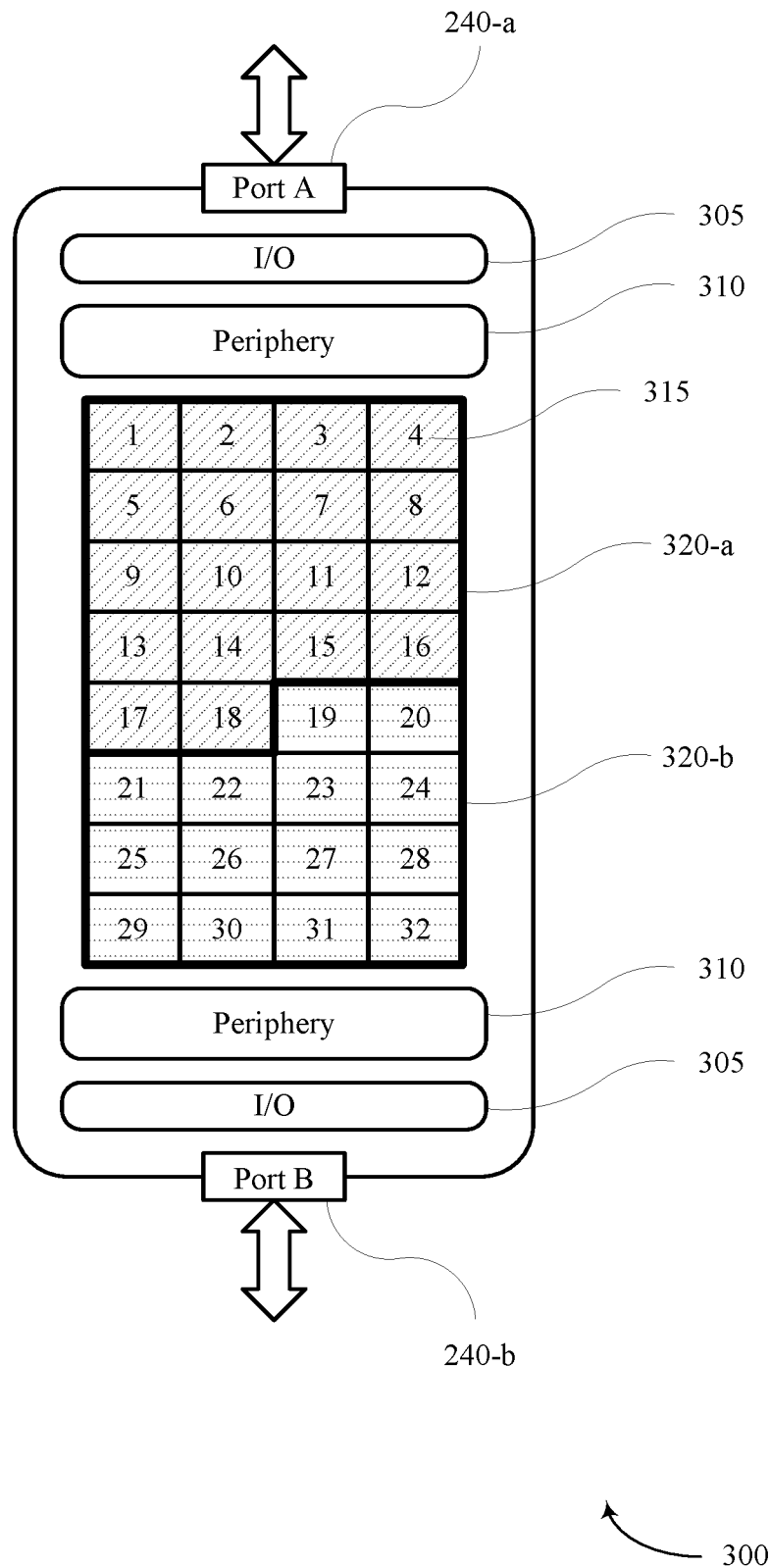
FIG. 3 illustrates an example of a memory subsystem that supports a memory system with selectively interfaceable memory subsystem in accordance with examples as disclosed herein.

FIG. 3 illustrates an example of a memory subsystem 300 that supports a memory system with selectively interfaceable memory subsystem in accordance with examples as disclosed herein. The memory subsystem 300 may be an example of the third memory subsystem 220-*c*, described with reference to FIG. 2.

Memory subsystem 300 may include a plurality of ports 240, such as first port 240-*a* and second port 240-*b*. The memory subsystem 300 may also include any quantity of ports 240 (e.g., one, two, three, four, five, six, seven, eight, etc.). The ports 240 may be used to access the memory of memory subsystem 300. As described herein, the ports 240 may be used to communicate with the host system 205 using different interfaces 215. Memory subsystem 300 may include an I/O interface 305 and a periphery component 310 corresponding to each port 240. The I/O interface 305 may include drivers and receivers related to communication between the port 240 and components external to the memory subsystem 300. The periphery component 310 may include other components used by the port to access the memory of memory subsystem 300, such as drivers for word lines or digit lines, sense components, and other components. In some examples, each periphery component 310 may access some or all of the memory of the memory subsystem 300. In some cases, each periphery component 310 (and thus, each port 240) may be configurable to access any portion of the memory of memory subsystem 300. Some of the periphery components may be positioned underneath an area of the memory cells (e.g., as part of a CMOS-under-array (CuA) configuration).

To prevent the host system 205 from accessing the same memory cells through different interfaces 215, the memory of memory subsystem 300 may be partitioned into separate portions 320. In some examples, the accessible address range corresponding to each partition 320 may be defined, either statically or dynamically. Each portion 320 may be configurable to communicate information with the host system 205 via one or both of the interfaces 215. For example, a first portion 320-*a* may be selectively configurable to communicate information with the host system 205 via the first interface 215-*a* and the second interface 215-*b* and a second portion 320-*b* may be selectively configurable to communicate information with the host system 205 via the first interface 215-*a* and the second interface 215-*b*. In some examples, the second portion 320-*b* may be selectively configurable to communicate information with the host system 205 via the first interface 215-*a* and the second interface 215-*b* independent from whether the first portion 320-*a* uses the first interface 215-*a* or the second interface 215-*b*. In some examples, each portion 320 may be configured to communicate with the host system 205 via separate interfaces. In some examples, one or more registers may be used to configure the portions, port assignments, and other configurations.

In some examples, memory subsystem 300 may include a plurality of memory blocks 315 each assigned to a portion 320. In the example reflected in FIG. 3, memory subsystem 300 may include 32 memory blocks 315, with blocks 1-18 being assigned to the first portion 320-*a* and blocks 19-32 being assigned to the second portion 320-*b*. In some examples, the size of each portion 320 may be reconfigurable either dynamically or semi-statically. In some cases, the host system 205, the memory system 210, the memory subsystem 220-*c*, or a combination thereof may be configured to adjust the sizes of the portions 320 or the allocation of different portions or blocks to different ports.

The different portions 320 may be allocated to the different ports 240. Each portion 320 may be assigned to a different port 240 so that information to and from the portion 320 may pass through the assigned port 240. For example, the first portion 320-*a* may be assigned to the first port 240-*a* and the second portion 320-*b* may be assigned to the second port 240-*b* or vice versa. In some examples, the ports 240 to which the portions 320 are assigned may be dynamically reconfigurable.

The interface bridge 235 may couple each port to one of the interfaces 215, based on the configuration of the third memory subsystem 300. As such, information communicated between each portion 320 and the host system 205 may be routed through the interface 215 to which the corresponding port 240 is coupled. In this manner, information may be communicated between the host system 205 and the memory subsystem 300 using both interfaces 215 concurrently. In some examples, the interface 215 to which the ports 240 are coupled may be dynamically reconfigurable.

The memory system 210 and its components may be dynamically configured by the host system 205. In some examples, the host system 205 may send one or more indications to the memory system 210 via the interfaces 215 or any other interface. In some examples, the indications may be received and processed by the interface bridge 235, a controller, one or more of the memory subsystems 220, or other component. If sent to a memory subsystem 220, the indications may be received and processed by the memory subsystem controller 115 or local controller 135 (described with reference to FIG. 1) or other memory subsystem component, such as a controller, a CPU, or other component.

Figure 4:
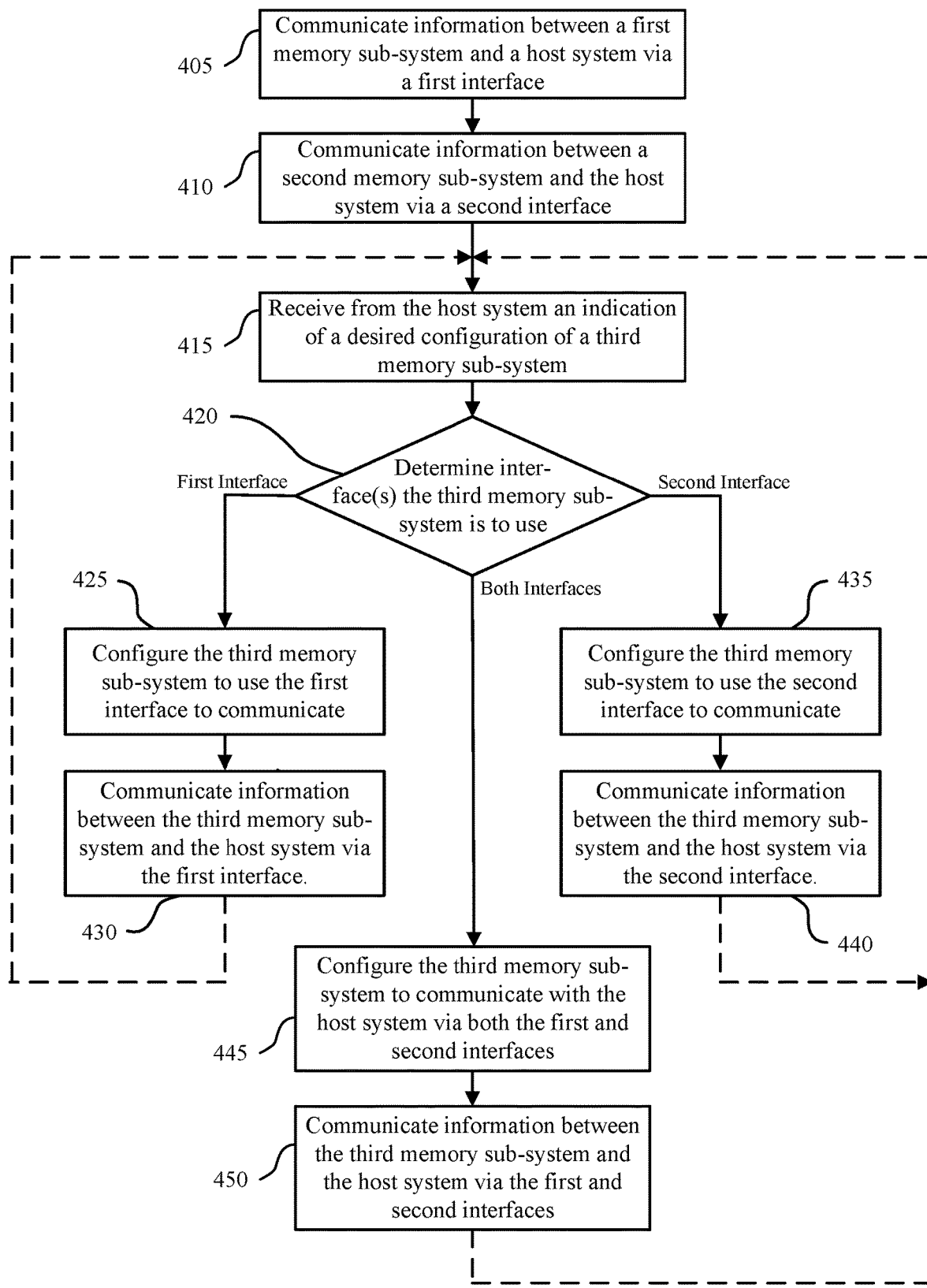
FIG. 4 shows a flowchart illustrating a method that supports a memory system with selectively interfaceable memory subsystem in accordance with examples as disclosed herein.

FIG. 4 shows a flowchart illustrating a method 400 that supports a memory system with selectively interfaceable memory subsystem in accordance with examples as disclosed herein. The method 400 may be configured such that the size of memory and storage may be dynamically adjusted to match a system's needs The operations of method 400 may be implemented by a memory system or memory subsystem or its components as described herein. In some examples, a memory system or memory subsystem may execute a set of instructions to control the functional elements of the memory system to perform the described functions. Additionally or alternatively, a memory system may perform aspects of the described functions using special-purpose hardware.

At 405, information may be communicated between a first memory subsystem and a host system via a first interface. In some examples, the first memory subsystem may be a first type of memory. In some examples, the first memory subsystem may be a nonvolatile type. In some examples, the first interface may be a nonvolatile-memory interface.

At 410, information may be communicated between a second memory subsystem and the host system via a second interface. In some examples, the second memory subsystem may be a second type of memory. In some examples, the second memory subsystem may be a volatile type. In some examples, the second interface may be a volatile-memory interface.

At 415, an indication of a desired configuration of a third memory subsystem may be received (e.g., by a memory system from the host system). In some examples, the third memory subsystem may be a third type of memory. In some examples, the indication may be received via the first interface or the second interface or other interface. In some examples, the third memory subsystem may be dynamically configured based on the indication.

At 420, it may be determined which interface(s) a third memory subsystem is to use, based on the indication. If the memory system determines that the third memory subsystem is to use the first interface, the method may continue to 425. If the memory system determines that the third memory subsystem is to use the second interface, the method may continue to 435. If the memory system determines that the third memory subsystem is to use both the first interface and the second interface, the method may continue to 445.

At 425, the third memory subsystem may be configured to use the first interface to communicate with the host system. In some examples, the configuration may be performed by an interface bridge, a controller, one or more of the memory subsystems, or other component.

At 430, information may be communicated between the third memory subsystem and the host system via the first interface.

At 435, the third memory subsystem may be configured to use the second interface to communicate with the host system. In some examples, the configuration may be performed by an interface bridge, a controller, one or more of the memory subsystems, or other component.

At 440, information may be communicated between the third memory subsystem and the host system via the second interface.

At 445, the third memory subsystem may be configured to communicate with the host system via both the first interface and the second interface. In some examples, the configuration may be performed by an interface bridge, a controller, one or more of the memory subsystems, or other component. In some examples, the memory system may configure a first portion of the third memory subsystem to communicate with the host system via one of the interfaces and a second portion of the third memory subsystem to communicate with the host system via the other interface. In some examples, the third memory subsystem may include a first port and a second port and the memory system may determine which port the information corresponding to each portion may be communicated.

At 450, information may be communicated between the third memory subsystem and the host system via the first interface and the second interface. In some examples the information may be communicated between the third memory subsystem and the host system via the first interface and the second interface concurrently. In some examples, the third memory subsystem may include a first port and a second port through which the information is communicated. In some examples, the information communicated through the first port may be routed through one of the interfaces and the information communicated through the second port may be routed through the other interface. In some examples, a first portion of the third memory subsystem communicates with the host system via one of the interfaces and a second portion of the third memory subsystem communicates with the host system via the other interface.

As indicated by the dashed line, one or more portions of method 400 may be repeated during operation. For example, after operations described in 430, 440, or 450, the method may return to 415 and receive another indication. Each time the operation of 415 is repeated, the indication received at 415 may be different than the indication that was received the last time the operation was run. The new indication may specify changes to the interface the third memory subsystem is to use, the configuration of any memory portions or ports, etc. Then at 425, 435, or 445, the third memory may be reconfigured based on the new indication. As such, the third memory subsystem may be dynamically reconfigurable.

Figure 5:
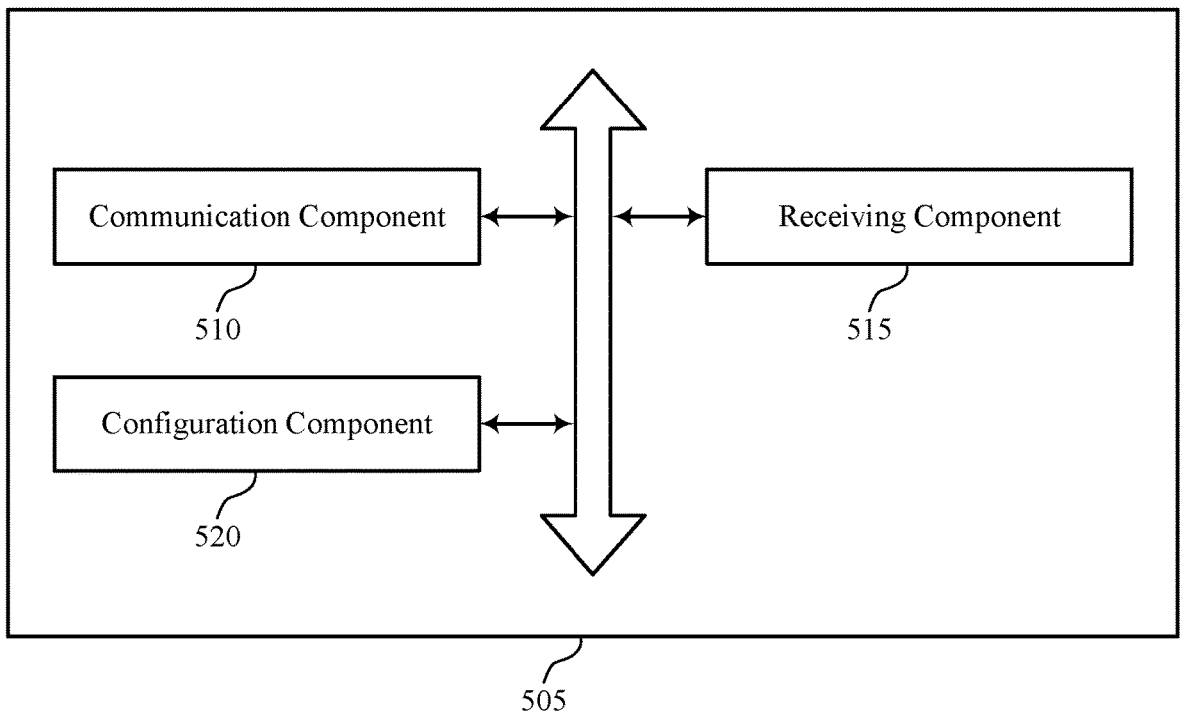
FIG. 5 shows a block diagram of a memory system that supports a memory system with selectively interfaceable memory subsystem in accordance with examples as disclosed herein.

FIG. 5 shows a block diagram 500 of a memory system 505 that supports a memory system with selectively interfaceable memory subsystem in accordance with examples as disclosed herein. The memory system 505 may be an example of aspects of a memory system as described with reference to FIGS. 2-4. The memory system 505 may include a communication component 510, a receiving component 515, and a configuration component 520. Each of these modules may communicate, directly or indirectly, with one another (e.g., via one or more buses).

The communication component 510 may communicate, via a first interface of the memory system, first information between a first memory subsystem of the memory system and a host system, the first memory subsystem being a first type of memory. In some examples, the communication component 510 may communicate, via a second interface of the memory system, second information between a second memory subsystem of the memory system and the host system, the second memory subsystem being a second type of memory. In some examples, the communication component 510 may communicate, via the first interface or the second interface, third information between the third memory subsystem and the host system based on configuring the third memory subsystem.

In some examples, the communication component 510 may communicate, via the first interface, third information between the third memory subsystem and the host system. In some examples, the communication component 510 may communicate, via the second interface, fourth information between the third memory subsystem and the host system.

In some cases, the third information may be communicated between the third memory subsystem and the host system through a first port. In some cases, the fourth information may be communicated between the third memory subsystem and the host system through a second port.

In some cases, the third memory subsystem may be configured as a nonvolatile memory subsystem when communicating information via the first interface and as a volatile memory subsystem when communicating information via the second interface.

The receiving component 515 may receive, via the first interface or the second interface, an indication of whether a third memory subsystem of the memory system is to communicate with the host system using the first interface, the second interface, or both. The third memory subsystem may be a third type of memory. In some cases, the receiving component 515 may receive a second indication from the host system after configuring a first portion of the third memory subsystem.

The configuration component 520 may configure the third memory subsystem to communicate with the host system via the first interface, the second interface, or both based on the indication. In some examples, the configuration component 520 may configure a first portion of the third memory subsystem to communicate with the host system via the first interface based on the indication. In some examples, the configuration component 520 may configure a second portion of the third memory subsystem to communicate with the host system via the second interface based on the indication, where configuring the third memory subsystem is based on configuring the first portion and the second portion. In some examples, the configuration component 520 may configure the first portion of the third memory subsystem to have a different size based on the second indication.

Figure 6:
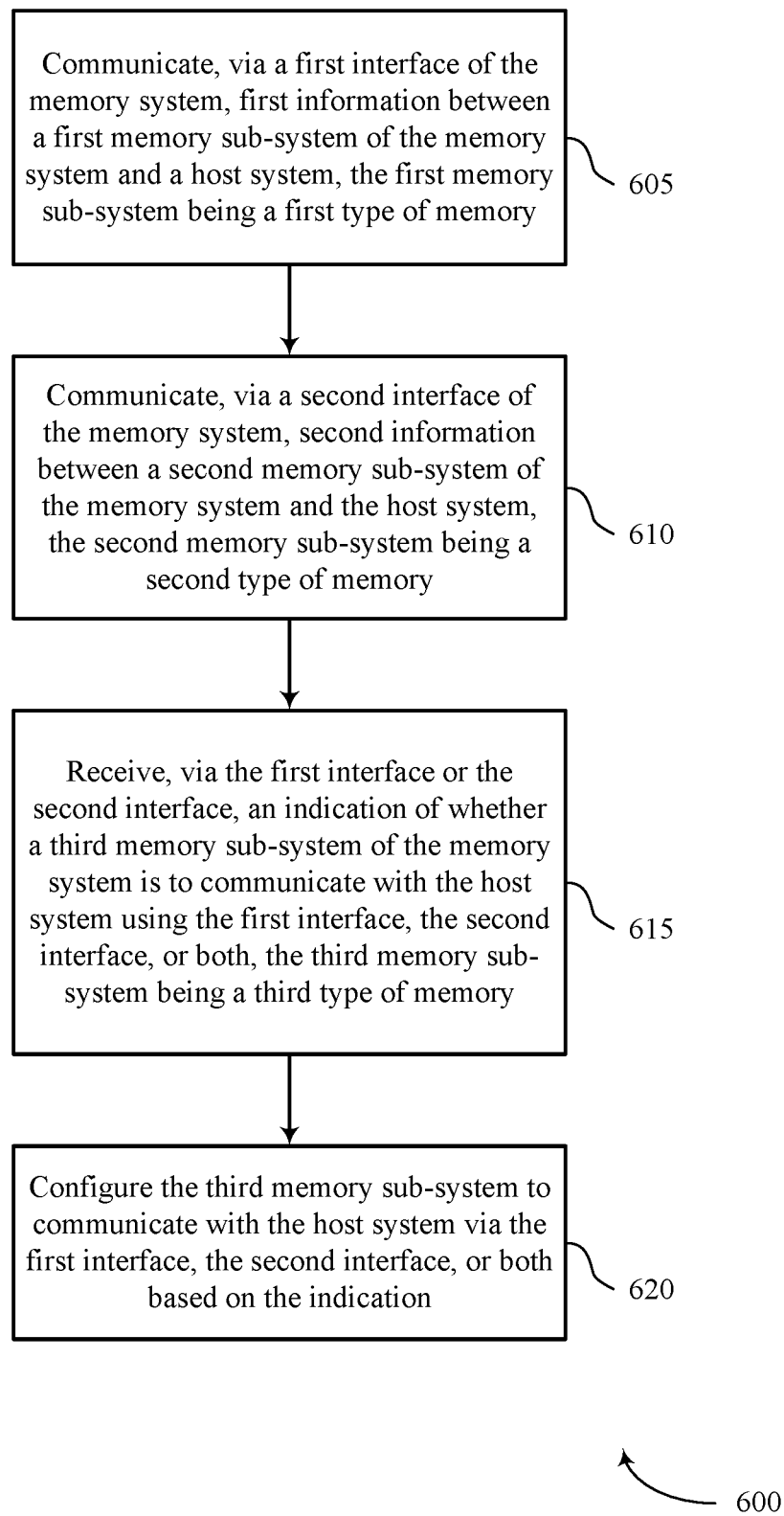
FIG. 6 shows a flowchart illustrating a method that supports a memory system with selectively interfaceable memory subsystem in accordance with examples as disclosed herein.

FIG. 6 shows a flowchart illustrating a method 600 that supports a memory system with selectively interfaceable memory subsystem in accordance with examples as disclosed herein. The operations of method 600 may be implemented by a memory system or its components as described herein. For example, the operations of method 600 may be performed by a memory system as described with reference to FIG. 5. In some examples, a memory system may execute a set of instructions to control the functional elements of the memory system to perform the described functions. Additionally or alternatively, a memory system may perform aspects of the described functions using special-purpose hardware.

At 605, the memory system may communicate, via a first interface of the memory system, first information between a first memory subsystem of the memory system and a host system, the first memory subsystem being a first type of memory. The operations of 605 may be performed according to the methods described herein. In some examples, aspects of the operations of 605 may be performed by a communication component as described with reference to FIG. 5.

At 610, the memory system may communicate, via a second interface of the memory system, second information between a second memory subsystem of the memory system and the host system, the second memory subsystem being a second type of memory. The operations of 610 may be performed according to the methods described herein. In some examples, aspects of the operations of 610 may be performed by a communication component as described with reference to FIG. 5.

At 615, the memory system may receive, via the first interface or the second interface, an indication of whether a third memory subsystem of the memory system is to communicate with the host system using the first interface, the second interface, or both, the third memory subsystem being a third type of memory. The operations of 615 may be performed according to the methods described herein. In some examples, aspects of the operations of 615 may be performed by a receiving component as described with reference to FIG. 5.

At 620, the memory system may configure the third memory subsystem to communicate with the host system via the first interface, the second interface, or both based on the indication. The operations of 620 may be performed according to the methods described herein. In some examples, aspects of the operations of 620 may be performed by a configuration component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for communicating, via a first interface of the memory system, first information between a first memory subsystem of the memory system and a host system, the first memory subsystem being a first type of memory, communicating, via a second interface of the memory system, second information between a second memory subsystem of the memory system and the host system, the second memory subsystem being a second type of memory, receiving, via the first interface or the second interface, an indication of whether a third memory subsystem of the memory system is to communicate with the host system using the first interface, the second interface, or both, the third memory subsystem being a third type of memory, and configuring the third memory subsystem to communicate with the host system via the first interface, the second interface, or both based on the indication.

Some examples of the method 600 and the apparatus described herein may further include operations, features, means, or instructions for communicating, via the first interface or the second interface, third information between the third memory subsystem and the host system based on configuring the third memory subsystem.

Some examples of the method 600 and the apparatus described herein may further include operations, features, means, or instructions for communicating, via the first interface, third information between the third memory subsystem and the host system, and communicating, via the second interface, fourth information between the third memory subsystem and the host system.

In some examples of the method 600 and the apparatus described herein, the third memory subsystem may include operations, features, means, or instructions for a first port through which the third information may be communicated between the third memory subsystem and the host system, and a second port through which the fourth information may be communicated between the third memory subsystem and the host system.

Some examples of the method 600 and the apparatus described herein may further include operations, features, means, or instructions for configuring a first portion of the third memory subsystem to communicate with the host system via the first interface based on the indication, and configuring a second portion of the third memory subsystem to communicate with the host system via the second interface based on the indication, where configuring the third memory subsystem may be based on configuring the first portion and the second portion.

Some examples of the method 600 and the apparatus described herein may further include operations, features, means, or instructions for receiving a second indication from the host system after configuring the first portion of the third memory subsystem, and configuring the first portion of the third memory subsystem to may have a different size based on the second indication.

In some examples of the method 600 and the apparatus described herein, the third memory subsystem may be configured as a nonvolatile memory subsystem when communicating information via the first interface and as a volatile memory subsystem when communicating information via the second interface.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first memory subsystem of a first type that may be configured to communicate information with a host system via a first interface, a second memory subsystem of a second type that may be configured to communicate information with the host system via a second interface, and a third memory subsystem of a third type that may be selectively configurable to communicate information with the host system via the first interface and the second interface.

In some examples, the third memory subsystem may include operations, features, means, or instructions for a first port configured to cause the third memory subsystem to communicate information with the host system via the first interface, and a second port configured to cause the third memory subsystem to communicate information with the host system via the second interface.

In some examples, the third memory subsystem may include a first type of memory first portion of memory cells coupled with the first port and a second portion of memory cells coupled with the second port. In some examples, a first size of the first portion and a second size of the second portion may be dynamically reconfigurable.

In some examples, the third memory subsystem may include operations, features, means, or instructions for a first portion of memory cells selectively configurable to communicate information with the host system via the first interface and the second interface, and a second portion of memory cells selectively configurable to communicate information with the host system via the first interface and the second interface. In some examples, the second portion of the third memory subsystem may be selectively configurable to communicate information with the host system via the first interface and the second interface independent from whether the first portion uses the first interface or the second interface. In some examples, a first size of the first portion and a second size of the second portion may be reconfigurable.

In some examples, the third memory subsystem may include a set of ports through which the third memory subsystem may be configured to communicate information with the host system.

In some examples, the third memory subsystem may be configured as a nonvolatile memory subsystem when communicating information via the first interface and as a volatile memory subsystem when communicating information via the second interface.

In some examples, the third memory subsystem of the third type may include one or more resistive RAM memory cells, e.g., 3DXP memory cells. In some examples, the first memory subsystem of the first type may include one or more NAND memory cells, and the second memory subsystem of the second type may include one or more DRAM memory cells. In some examples, the first interface may include a DRAM interface, and the second interface may include a UFS interface.

An apparatus is described. The apparatus may include a nonvolatile memory subsystem that may be configured to communicate information with a host system via a first interface, a volatile memory subsystem that may be configured to communicate information with the host system via a second interface, and a third memory subsystem that may be configured to communicate information with the host system via the first interface and the second interface, the third memory subsystem configured as a second nonvolatile memory subsystem when communicating information via the first interface and as a second volatile memory subsystem when communicating information via the second interface.

In some examples, the third memory subsystem may be configured to communicate information via the first interface and the second interface concurrently. In some examples, the third memory subsystem may include a first port coupled with the first interface and a second port coupled with the second interface.

In some examples, the third memory subsystem may include one or more resistive RAM memory cells, e.g., 3DXP memory cells. In some examples, the nonvolatile memory subsystem may include one or more NAND memory cells, and the volatile memory subsystem may include one or more DRAM memory cells. In some examples, the first interface may include a DRAM interface, and the second interface may include a UFS interface.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label (e.g., "215-a") that distinguishes among the similar components. If just the first reference label is used in the specification (e.g., "215"), the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory system, comprising:
    a first memory subsystem comprising first memory cells of a first type of memory, the first type of memory comprising non-volatile memory, and wherein the first memory subsystem is configured to communicate information with a host system via a first interface associated with the first type of memory;
    a second memory subsystem comprising second memory cells of a second type of memory different than the first type of memory, the second type of memory comprising volatile memory, and wherein the second memory subsystem is configured to communicate information with the host system via a second interface associated with the second type of memory; and
    a third memory subsystem comprising third memory cells of a third type memory that includes the first type of memory and the second type of memory, wherein the third memory cells comprise a first portion of third memory cells dynamically configured as the first type of memory and a second portion of third memory cells dynamically configured as the second type of memory, wherein the third memory subsystem is selectively configurable to communicate, with the host system, information from the first portion of third memory cells via the first interface and information from the second portion of third memory cells via the second interface.

2. The memory system of claim 1, wherein the third memory subsystem comprises:
    a first port configured to cause the first portion of third memory cells of the third memory subsystem to communicate information with the host system via the first interface; and
    a second port configured to cause the second portion of third memory cells of the third memory subsystem to communicate information with the host system via the second interface.

3. The memory system of claim 2, wherein:
    the first portion of third memory cells of the third memory subsystem is coupled with the first port; and
    the second portion of third memory cells of the third memory subsystem is coupled with the second port.

4. The memory system of claim 3, wherein a first size of the first portion of third memory cells and a second size of the second portion of third memory cells are dynamically reconfigurable.

5. The memory system of claim 1, wherein the second portion of third memory cells of the third memory subsystem is selectively configurable to communicate information with the host system via the first interface and the second interface independent from whether the first portion of third memory cells uses the first interface or the second interface.

6. The memory system of claim 5, wherein a first size of the first portion of third memory cells and a second size of the second portion of third memory cells are reconfigurable.

7. The memory system of claim 1, wherein the third memory subsystem includes a plurality of ports through which the third memory subsystem is configured to communicate information with the host system.

8. The memory system of claim 1, wherein:
    the first portion of third memory cells of the third memory subsystem is configured as a nonvolatile memory subsystem when communicating information via the first interface; and
    the second portion of third memory cells of the third memory subsystem is configured as a volatile memory subsystem when communicating information via the second interface.

9. The memory system of claim 1, wherein the third memory cells comprise one or more resistive RAM memory cells.

10. The memory system of claim 9, wherein:
    the first memory cells comprise one or more not-and (NAND) memory cells; and
    the second memory cells comprise one or more dynamic random access memory (DRAM) cells.

11. The memory system of claim 1, wherein:
    the first interface comprises a dynamic random-access memory (DRAM) interface; and
    the second interface comprises a universal flash storage (UFS) interface.

12. The memory system of claim 1, further comprising:
    an interface bridge coupled to the first interface and the second interface, wherein the interface bridge is configured to communicate information between a first port and a second port of the third memory subsystem and the host system concurrently via the first interface and the second interface.

13. A method performed by a memory system, the method comprising:

communicating, via a first interface of the memory system associated with a first type of memory, first information between a first memory subsystem of the memory system and a host system, the first memory subsystem comprising first memory cells of the first type of memory, wherein the first type of memory comprises non-volatile memory;

communicating, via a second interface of the memory system associated with a second type of memory different than the first type of memory, second information between a second memory subsystem of the memory system and the host system, the second memory subsystem comprising second memory cells of the second type of memory, wherein the second type of memory comprises volatile memory;

receiving, via the first interface or the second interface, an indication that a third memory subsystem of the memory system is to communicate with the host system using the first interface and the second interface, the third memory subsystem comprising third memory cells of a third type of memory that includes the first type of memory and the second type of memory, the third memory cells comprising a first portion of third memory cells dynamically configured as the first type of memory and a second portion of third memory cells dynamically configured as the second type of memory; and configuring the third memory subsystem to communicate with the host system via the first interface and the second interface based at least in part on the indication.

14. The method of claim 13, further comprising:
communicating, via the first interface, third information between the third memory subsystem and the host system based at least in part on configuring the third memory subsystem; and
communicating, via the second interface and concurrently with communicating the third information, fourth information between the third memory subsystem and the host system based at least in part on configuring the third memory subsystem.

15. The method of claim 13, further comprising:
communicating, via the first interface, third information between the third memory subsystem and the host system; and
communicating, via the second interface, fourth information between the third memory subsystem and the host system.

16. The method of claim 13, wherein the third memory subsystem is selectively configurable to:
communicate information from the first portion of third memory cells with the host system via the first interface; and
communicate information from the second portion of the third memory cells with the host system via the second interface.

17. The method of claim 13, further comprising:
configuring the first portion of third memory cells of the third memory subsystem to communicate with the host system via the first interface based at least in part on the indication; and
configuring the second portion of third memory cells of the third memory subsystem to communicate with the host system via the second interface based at least in part on the indication, wherein configuring the third memory subsystem is based at least in part on configuring the first portion of third memory cells and the second portion of third memory cells.

18. The method of claim 17, further comprising:
receiving a second indication from the host system after configuring the first portion of third memory cells of the third memory subsystem; and
configuring the first portion of third memory cells of the third memory subsystem to have a different size based at least in part on the second indication.

19. The method of claim 13, wherein:
the first portion of third memory cells of the third memory subsystem is configured as a nonvolatile memory subsystem when communicating information via the first interface; and
the second portion of third memory cells of the third memory subsystem is configured as a volatile memory subsystem when communicating information via the second interface.

20. A memory system, comprising:
a first nonvolatile memory subsystem that is configured to communicate information with a host system via a first interface associated with nonvolatile memory;
a first volatile memory subsystem that is configured to communicate information with the host system via a second interface associated with volatile memory;
an interface bridge coupled to the first interface and the second interface; and
a third memory subsystem that is configured to communicate information with the first interface and the second interface via the interface bridge, the third memory subsystem comprising:
  a first portion of a plurality of memory cells dynamically configured as a second nonvolatile memory subsystem when communicating information with the first interface; and
  a second portion of the plurality of memory cells dynamically configured as a second volatile memory subsystem when communicating information with the second interface.

\* \* \* \* \*